Nov. 23, 1965 R. S. ENGELBRECHT 3,219,941

NONRECIPROCAL WIDE-BAND PARAMETRIC AMPLIFIER

Filed June 13, 1963 2 Sheets-Sheet 1

INVENTOR
R. S. ENGELBRECHT
BY David P. Kelley
ATTORNEY 3,219,941

NONRECIPROCAL WIDE-BAND PARAMETRIC AMPLIFIER

Rudolf S. Engelbrecht, Bernardsville, N.J., assignor to Bell Telephone Laboratories, Incorporated, New York, N.Y., a corporation of New York Filed June 13, 1963, Ser. No. 287,724
11 Claims. (Cl. 330—4.9)

This invention relates to electromagnetic wave amplifiers, and, more particularly, to parametric amplifiers utilizing solid state devices as the amlpifying means.

Solid state parametric amplifiers, such as, for example, those utilizing varactor diodes as the variable reactance, are well known in the art, and have proven to be highly useful due to their properties of high gain, low noise, and relative simplicity and reliability. Such devices, however, are inherently unstable, and tend to amplify signals introduced from either the input or output terminals. Thus, signals reflected from the load or a subsequent amplifier stage are amplified also, with the net result that the amlpifier tends to oscillate.

Heretofore, it has been the practice to insert isolators or circulators between the amlpifier and the load, or between adjacent amplifier stages in an iterated or cascaded system to present a high attenuation to reflected energy, while permitting the amplified energy to pass to the load or succeeding stages. Such arrangements have generally been successful, but they suffer the disadvantages of undue complication of the system, and, in the case of iterated amplifier systems, an undesirable increase in the size of the system. In addition, in an iterated structure especially, the diode characteristics and the isolator and other circuit characteristics must be matched within very close tolerance limits to achieve the desired nonreciprocal, stable amplifier system. In general, such arrangements also tend to have an undesirably narrow bandwidth, inasmuch as the isolator characteristics tend to change with changes in frequency, thereby exceeding the matching tolerances and reducing or eliminating stability completely.

It is an object of the present invention to eliminate the necessity of providing separate isolator stages between amplifier stages.

It is another object of the present invention to reduce materially the dependence of a broad band parametric amplifier arrangement on circuit and diode tolerances.

It is a further object of the present invention to produce broad band amplification utilizing an amplifier unit of simple construction that lends itself readily to iterated systems.

In United States Patent 3,162,826, issued to R. S. Engelbrecht December 22, 1964, there is disclosed a nonreciprocal wave transmission device which utilizes the power dividing characteristics of a 3 db directional coupler and the power absorbing characteristics of a resonantly biased gyromagnetic element placed between two cross-conjugate arms of the coupler to achieve isolation or nonreciprocity. Such an arrangement produces isolation over a broad band of frequencies. The present invention makes use of such an arrangement in a parametric amplifier configuration to achieve a high degree of amplifier stability within the amplifier stage itself.

In a first illustrative embodiment of the invention, the amplifier comprises a 3 db directional coupler having conjugate arms which intersect each other at a ninety degree angle. A member of gyromagnetic material is placed at the point of intersection of the two arms. Inasmuch as the 3 db directional coupler produces a ninety degree phase difference of the wave energy in the two arms, the ninety degree angle of intersection of the two arms produces a circular polarization of the high frequency magnetic field within the gyromagnetic member. As pointed out in the aforementioned Engelbrecht patent, with the application of a static magnetic field of proper strength and orientation a gyromagnetic resonance condition can be created. When the frequency of the applied high frequency fields is the same as the precision frequency of the magnetic moments in the material, a large power absorption for one direction of polarization of the applied high frequency fields occurs, while substantially no absorption occurs for the opposite direction of polarization. Accordingly, a magnetic field is applied to the gyromagnetic member of the present invention to create this nonreciprocal condition.

In accordance with the present invention, a varactor diode is connected to each of the conjugate arms of the coupler between the coupling region and the gyromagnetic material. Inasmuch as the energies in the two arms are ninety degrees out of phase, the diodes are oppositely polarized with respect to ground. Energy from a pump source which is approximately twice the signal freqeuency is capacitively coupled to each of the conjugate arms to pump the two diodes. Each of the conjugate arms has a pump trap to prevent pump energy from appearing at the output of the amplifier.

The two conjugate arms beyond their point of intersection are terminated by being short circuited to ground. In accordance with the invention, the length of these arms from the point where the diodes are connected thereto to the point where they are connected to the ground is sufficient to create an inductance in each arm which cancels out the average capacitance of the diodes connected to each arm.

With such an arrangement as just described, signal energy to be amplified is applied at the input of the amplifier, divided equally between two conjugate arms of the coupler, amplified by the action of the pumped varactor diodes, and in the present embodiment, where the pump frequency is twice the signal frequency, appears at the output of the amplifier along with the idler frequency and in phase therewith. On the other hand, energy reflected back from the output toward the input is absorbed by the gyromagnetic member. As a consequence, unconditionally stable amplification occurs.

In a second illustrative embodiment of the invention, the conjugate arms which are terminated to ground are capacitively coupled to a series resonant system which is resoant at the idler frequency. In this embodiment, the pump frequency is not twice the signal frequency, hence, the idler and signal frequencies are different, and the idler passes through the series resonant system while the signal is blocked thereby. The idler energy, after passing through the two series resonant circuits, which form a part of a pair of conjugate arms of a second 3 db coupler, is coupled to an output by the coupler. Thus, the signal and idler are separated and propagated separately for independent utilization. In an iterated structure, proper use of phase shifters permits addition of the idler from all of the stages.

In still another illustrative embodiment of the invention, which is a modification of the second illustrative embodiment, the idler is eliminated completely from the basic circuit and isolation is provided for the idler, or the idler can be completely absorbed. This is of particular advantage where the pump sources applied to the various amplifying stages are incoherent. In this particular embodiment, the two conjugate arms containing the series resonant circuit intersect at right angles, and a properly biased member of gyromagnetic material is positioned at the intersection. Depending on the orientation of the biasing magnetic field, the idler can be passed on to the next succeeding amplifier stage, or absorbed by the material. In the case where the idler is passed on to the next stage, the gyromagnetic member absorbs any reflections in the idler circuit. Thus, isolation is provided for the idler circuit also.

It is a feature of the present invention that the functions of amplification and isolation are combined in the single amplifier unit, thereby eliminating the necessity of adhering to close tolerances in matching the amplifier output to a load or succeeding stage of amplification.

It is another feature of the present invention that the amplifier unit is unconditionally stable for both signal and idler frequencies.

It is still another feature of the present invention that the principles thereof are readily adaptable to a wide variety of transmission media, such as, for example, strip lines, waveguides, and coaxial lines.

These and other objects and features of the present invention will be readily apparent from the following description, taken in conjunction with the accompanying drawings, in which.

Figure 1:
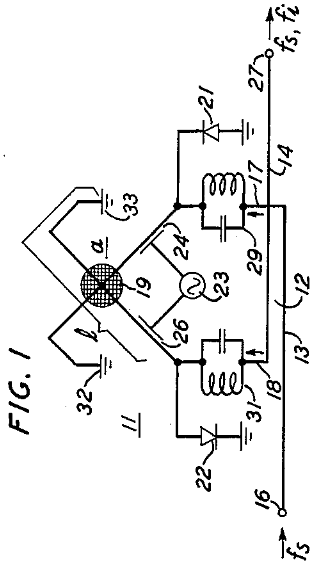
FIG. 1 is a schematic diagram of a basic amplifier unit embodying the principles of the invention.

Turning now to FIG. 1, there is depicted schematically an amplifier circuit 11 embodying the principles of the present invention. Amplifier 11 comprises a directional coupler 12 of well-known design, which comprises a first or input section 13 of transmission line and a second section 14 of transmission line in coupling relationship with section 13. The coupling interval is such that one half of the signal power $f_s$ introduced at input 16 of the amplifier is transferred from line 13 to line 14, with a ninety-degree phase shift between the wave energies in the two lines. Lines 13 and 14 may be regarded as a first pair of conjugate arms of the coupler and their extensions, lines 17 and 18, respectively, may be regarded as a second pair of conjugate arms. Arms 17 and 18 are extended and cross each other at right angles at the point *a*. At point *a*, there is located an element 19 of gyromagnetic material, which is of the type which, when magnetically polarized exhibits a precessional motion of its atoms under the influence of a high frequency electromagnetic field. Typical of such materials are paramagnetic and ferromagnetic materials, one example of the latter being yttrium-iron-garnet (YIG). Other types of materials exhibiting the aforementioned properties may also be used. Element 19 has applied thereto a static magnetic field of sufficient strength to establish gyromagnetic resonance at the center of the frequency band of interest from a source which, for simplicity, has not been shown, and which may be any one of a number of suitable means well-known in the art. It is also possible to produce a permanent magnetization of the element 19, in which case external magnetic biasing means are not necessary.

Between the coupler 12 and the intersection *a* of the arms 17 and 18, a pair of varactor diodes 21 and 22 are connected to arms 17 and 18, respectively, with their other terminals connected to ground. Diodes 21 and 22 may be any one of a number of types of varactor diodes known in the art which exhibit a variable capacitance under the influence of electromagnetic pumping energy. The diodes may be operated with a slight reverse bias applied thereto, or they may be operated at zero bias. The arrangement of FIG. 1 shows them at zero bias, but it is to be understood that a bias may be applied to them if conditions warrant or require such a bias. A pump source 23 supplies energy at twice the signal frequency $f_s$ to diodes 21 and 22 through capacitive couplers 24 and 26. As explained in the aforementioned Engelbrecht application, the wave energy in the two intersecting arms should be ninety degrees out of phase to produce a circularly polarized field at intersection *a*. In order to preserve this ninety-degree phase difference, which is produced by coupler 12, diodes 21 and 22 are oppositely poled with respect to ground, as shown, with the consequence that they are pumped 180° out of phase by source 23. The energy in the two arms beyond the diode connection is, therefore, ninety degrees out of phase, as desired.

In order that pump energy does not appear in coupler 12 and hence at either input 16 or output 27 arms 17 and 18 have pump traps 29 and 31, respectively, located between coupler 12 and the points where the diodes are connected to arms 17 and 18. Traps 29 and 31 are depicted in FIG. 1 as being parallel resonant circuits, resonant at the pump frequency. It is to be understood that other types of traps or filters well known in the art may be used to prevent the pump energy from reaching coupler 12, the arrangement shown here being for purposes of illustration only.

Arms 17 and 18, after intersecting at point *a* are terminated or short circuited to ground at points 32 and 33, respectively. In order that the average capacitance of the diodes may be effectively masked, for reasons to be explained hereinafter, the length *l* of arms 17 and 18 from the points of connection of the diodes to the ground terminations 32 and 33 is such that an inductance of sufficient magnitude to mask the average capacitance of the diodes exists. This length *l*, of course, depends upon the frequency of operation and the diode characteristics, which, in turn, depend upon the diode itself.

In operation, a signal $f_s$ to be amplified is introduced at terminal 16 and passes along line 13 to coupler 12. The energy on line 13 is divided equally in the 3 db coupler 12 so that half of the energy passes to line 14 and thence to arm 18, while the remaining half of the energy passes from line 13 to arm 17. As is typical of such couplers, there is created a ninety-degree phase difference between the energies in the arms 17 and 18. The energy in the arms 17 and 18 passes through the traps or filters 29 and 31 and is amplified by the varying capacitances of pumped diodes 21 and 22 in a manner well known in the parametric amplifier art. As a result of this parametric amplification of the signal energy, there is generated an idler wave $f_i$ in each arm 17 and 18 which is, in the present embodiment, where the pump energy is twice the frequency of the signal $f_s$ (the degenerate case), equal in frequency and in phase with the signal energy in each arm.

The amplified energy in the arms 17 and 18 is combined at the intersection of the arms at point *a* and, being ninety degrees out of phase both with respect to true and spatially to each other, produces a circularly polarized electromagnetic field in the element 19. As is discussed in the aforementioned Engelbrecht application, the magnetic bias applied to element 19 is chosen to produce an inherent precessional frequency that is opposite in direction of rotation to that of the circularly polarized field, with the result that the energy in arms 17 and 18 pass through member 19 without attenuation. Inasmuch as arms 17 and 18 are short circuited to ground at points 32 and 33, respectively, the energy in each of the arms is reflected back through member 19, further amplified by diodes 21 and 22 and passes into coupler 12. The characteristics of coupler 12, which are typical of most 3 db couplers are such that the energy in arm 17, instead of passing through arm 13 to input 16, is coupled into arm 14 in phase with the energy from arm 18, with which it combines, and there appears at output 27 both amplified signal and idler waves which are in phase with each other. This amplified energy may be fed directly to another amplifier stage, or to a load. It is not necessary that the succeeding stage or load be carefully matched to the amplifier output inasmuch as any reflected energy enters the amplifier and is divided equally between arms 17 and 18 with a ninety-degree phase difference which produces at intersection *a* a circularly polarized field having the same direction of rotation as the precessional rotation of the magnetic moments in element 19. As a consequence, as explained more fully in the aforementioned Engelbrecht application, the energy is absorbed. The basic amplifier unit, therefore, provides both amplification and isolation, with the result that it is a stable, nonreciprocal amplifier and does not require the observance of close tolerance in matching its output impedance to the impedance of a subsequent stage or load.

As was pointed out in the foregoing, the length *l* of the arms 17 and 18 from the points of connection of the diodes to the termination points 32 and 33 is of a length such that, at the frequency of interest, it forms an inductance which masks the average diode capacitance. As a consequence, the diodes appear, at the signal frequency, to be substantially pure negative resistance devices with substantially no reactive component, thereby insuring maximum amplification of the signal.

Figure 2:
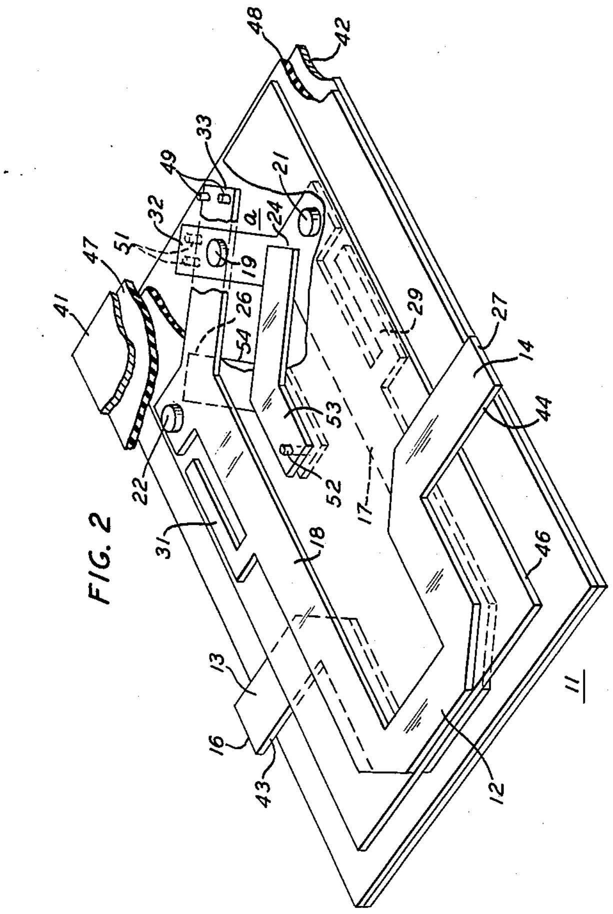
FIG. 2 is a perspective view of the circuit of FIG. 1 as used with strip transmission lines.

As was previously pointed out, the present invention can be used readily with a number of different types of transmission lines. In FIG. 2, there is depicted a strip line arrangement of the amplifier circuit of FIG. 1, by way of demonstrating the adaptability of the invention to various applications. In the arrangement of FIG. 2, where feasible, the numeral designation of various elements is the same as in FIG. 1 for a better comprehension of the arrangement of FIG. 2.

In the embodiment of FIG. 2, amplifier 11 comprises first and second ground planes 41 and 42 of conducting material and center conductors 43 and 44 which are separated from each other by a layer of insulating material 46 and from the ground planes 41 and 42 by layers 47 and 48 of insulating material. The layers of insulating material may be made of any one of a number of suitable materials having low dielectric loss characteristics such as, for example, polystyrene or polyethylene, both of which are often used in strip transmission line circuits. Traps 29 and 31 are formed integral with center conductors 43 and 44 and are an odd multiple of quarter wavelengths at the pump frequency so that they represent a short circuit to the pump energy thereby preventing it from reaching coupler 12. Conductors 43 and 44 are short circuited to the ground planes 42 and 41, respectively, by shorting pins 51 and 49, respectively.

Pump energy is applied by means of a terminal 52 which is conductively connected to a pair of conducting tabs 53 and 54. Tab 53 is separated from conductor 43 by means of dielectric number 46, and thereby forms a capacitive coupling 24 with conductor 43. Tab 54 is separated from conductor 44 by dielectric member 46 and forms a capacitive coupling 26 with conductor 44.

The operation of the circuit of FIG. 2 is the same as described for the circuit of FIG. 1, and it is not necessary to repeat such description.

FIG. 2 is representative of one type of transmission line arrangement to which the present invention is readily adaptable. It is to be understood that various other types of transmission lines can also be used where desired. It can readily be appreciated that the arrangement of FIG. 2 can be duplicated any number of times in an iterated or cascaded arrangement. Such an iterated arrangement requires only a single pump source to provide all of the diodes in the iterated structure with pump energy.

Figure 3:
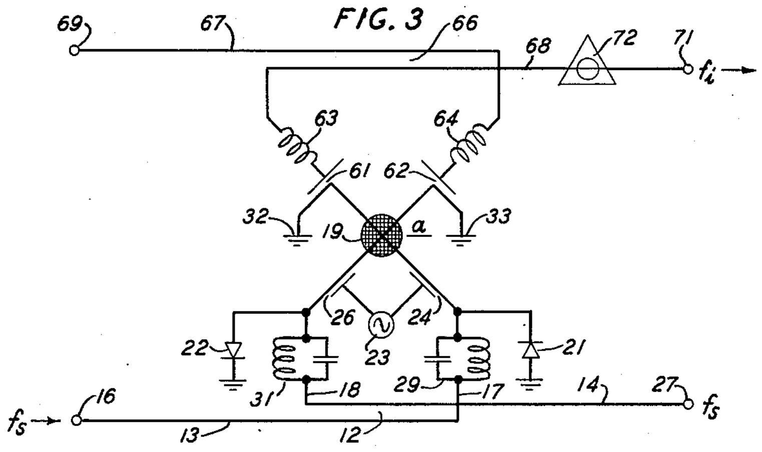
FIG. 3 is a schematic diagram of a second embodiment of the invention.

The circuits of FIGS. 1 and 2 illustrate the principles of the invention in the case where the signal and idler frequencies are the same, i.e., the pump is twice the signal frequency (degenerate case). In many applications it is often desirable or even necessary to operate with a pump frequency that is not twice the signal frequency (nondegenerate case). Under these conditions, it is desirable to separate the signal and idler, inasmuch as they are of different frequencies. The idler, however, since it bears whatever intelligence modulation is borne by the signal, and since it is also amplified, is a useful output of the amplifier. In FIG. 3, there is shown schematically a modification of the circuit of FIG. 1 which separates the signal and idler and propagates the idler along a separate transmission path for utilization. For simplicity, the elements of the circuit of FIG. 3 which are the same as, or equivalent to, the elements of the circuit of FIG. 1 bear the same reference numerals.

It can be seen that the circuit of FIG. 3 is substantially identical to the circuit of FIG. 1 from input 16 to ground terminations 32 and 33 to output 27, with the exception, of course, that pump source 23 supplies energy at a frequency that is not twice the signal frequency, thereby giving rise to an idler wave that is at a different frequency than the signal frequency. In order that the idler wave may be separated from the signal wave capacitive couplings 61 and 62 are provided for extracting the idler energy from arms 17 and 18, respectively. Capacitor couplers 61 and 62, in conjunction with inductances 63 and 64, form series resonant circuits which are resonant at the idler frequency. As a consequence, the idler energy by-passes the terminations 32 and 33 and passes through the resonant circuits to a 3 db directional coupler 66 having a pair of conjugate arms 67 and 68. Thus, the idler energy that was initially in arms 17 and 18 is coupled in coupler 66 and passes out through arm 68 to output terminal 71. To insure complete separation, the distance from coupler 61 to termination 32, and from coupler 62 to termination 33 is a quarter wavelength, or odd multiple thereof, at the idler frequency, thereby making the short circuits 32 and 33 appear as open circuits at the terminals 61 and 62. At the same time that the idler is extracted, the signal energy passes out of the amplifier through arm 14 and output 27, as explained in the description of the circuit of FIG. 1.

Where the amplifier circuit of FIG. 3 is one member of an iterated amplifier structure, idler energy from the preceding stage is fed into the circuit of FIG. 3 through input terminal 69 and arm 67. This energy is added to the idler energy produced in the amplifier of FIG. 3. In order that the energies may be added in proper phase, a phase shifter 72 is provided in each amplifier stage although in some instances, phase shifter 72 may not be necessary. The phase shifter may be any one of a number of types well known in the art, the simplest being simply a transmission line of the proper length to insure that the idler energy from one stage arrives at the succeeding stage in proper phase relationship with the idler generated in the succeeding stage.

Figure 4:
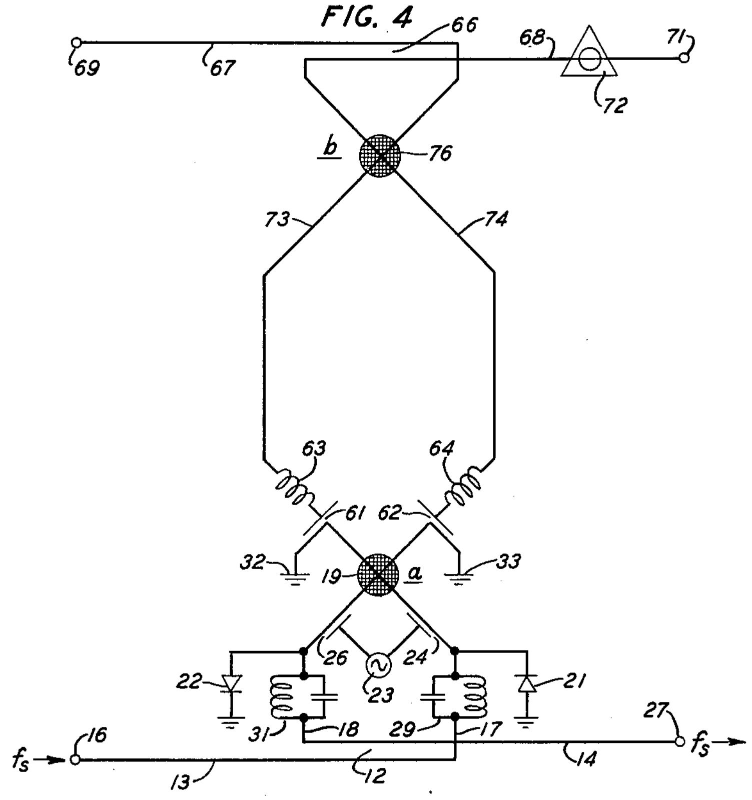
FIG. 4 is a schematic diagram of still another embodiment of the invention.

In FIG. 4, there is shown a modification of the circuit of FIG. 3 which is capable of separating the idler from the signal and propagating it separately or else eliminating the idler wave completely. Because of the similarity of the circuit of FIG. 4 to the circuit of FIG. 3, the same reference numerals have been used for the same or corresponding elements.

In the circuit of FIG. 4, the idler is separated from the signal in the same manner as explained in the discussion of FIG. 3. After passing through the series resonant circuits, the idler energy is fed to a pair of conjugate arms 73 and 74 of coupler 66. These arms 73 and 74 intersect at right angles at point *b*, where there is located a gyromagnetic element 76. Element 76 may be magnetically biased by suitable means, not shown, or by its own permanent magnetization, so that the idler energy passes through to coupler 66 and out through terminal 71 for utilization. On the other hand, where it is desirable to dispose of the idler energy, element 76 is magnetically biased to absorb the idler energy, thereby eliminating it. In addition, any reflected energy from succeeding stages in an iterated structure is absorbed also.

An iterated amplifier arrangement embodying the principles of the present invention utilizing eight stages of amplification and a single pump source at a frequency of 1900 mc. produced approximately 24 db of gain with 80 mw. of pump power, and approximately 58 db of reverse loss at a signal frequency of 950 mc.

From the foregoing it can readily be seen that the utilization of the principles of the present invention produces a broadband, stable amplifier of simple construction which, through making the isolating unit a part of the amplifier unit itself, lessens the dependence on close tolerances among the various elements. It is to be understood that the foregoing embodiments of the present invention are intended to be illustrative of the principles thereof. Other arrangements utilizing the principles of the invention may readily occur to workers in the art without departure from the spirit and scope of the invention.

What is claimed is:

1. A parametric amplifier comprising, in combination, a directional coupler having first and second pairs of conjugate arms, said second pair of conjugate arms being oriented to cross each other at right angles at a point along their lengths, a magnetically polarized element of gyromagnetic material located at the point of intersection of said second pair and being electromagnetically coupled to both arms of said second pair, a variable capacitance device connected to each of the arm of the said second pair between said coupler and said point of intersection, and means for coupling pump energy to each of said variable capacitance devices for varying the capacitance thereof.

2. A parametric amplifier as claimed in claim 1 including means for preventing pump energy from entering said coupler.

3. A parametric amplifier as claimed in claim 1 wherein each of the arms of said second pair is terminated to ground beyond said point of intersection.

4. A parametric amplifier as claimed in claim 3 wherein the length of each of said arms from the point of connection of the variable capacitance device to the point of termination to ground forms an inductance that masks the average capacitance of said variable capacitance device at the frequency of the signal to be amplified.

5. A parametric amplifier, as claimed in claim 4, wherein said variable capacitance devices comprise varactor diodes oppositely poled with respect to ground.

6. A parametric amplifier comprising, in combination, a first directional coupler having first and second pairs of conjugate arms, said second pair of conjugate arms being oriented to cross each other at right angles at a point along their lengths, a magnetically polarized element of gyromagnetic material located at the point of intersection of said second pair of arms and being electromagnetically coupled to both arms of said second pair, each of said second pair of arms being terminated to ground beyond the point of intersection, a variable capacitance device connected to each of the arms of the said second pair between said coupler and said point of intersection, means for coupling pump energy to each of said variable capacitance devices, capacitive coupling means coupled to each arm of said second pair between the point of intersection and the ground termination, an inductance in series with each of the capacitance coupling means for forming therewith a series resonant circuit resonant at the idler frequency, and a second directional coupler connected to each of the inductances.

7. A parametric amplifier as claimed in claim 6, wherein the length of each arm of said second pair from the capacitive coupling means to the ground terminating is one-quarter wavelength at the idler frequency.

8. A parametric amplifier, as claimed in claim 6, wherein the series resonant circuits are in one pair of conjugate arms of said second directional coupler, said directional coupler having a second pair of conjugate arms, at least one of which includes phase-shifting means.

9. A parametric amplifier, as claimed in claim 8, wherein said one pair of conjugate arms of said second directional coupler intersect at right angles at a point between said series resonant circuits and said coupler.

10. A parametric amplifier as claimed in claim 9, wherein a magnetically polarized element of gyromagnetic material is located at the point of intersection of said one pair of arms and electromagnetically coupled to said arms.

11. A parametric amplifier as claimed in claim 10, wherein the direction of polarization of said gyromagnetic element is such that idler energy in said one pair of arms is absorbed.

No references cited.

ROY LAKE, *Primary Examiner.*